(12) United States Patent
Kuth

(10) Patent No.: US 6,853,282 B2
(45) Date of Patent: Feb. 8, 2005

(54) MAGNETIC RESONANCE APPARATUS HAVING A GRADIENT COIL SYSTEM WITH STIFFENING ELEMENTS

(75) Inventor: Rainer Kuth, Herzogenaurach (DE)

(73) Assignee: Siemens Aktiengesellschaft, Münich (DE)

( * ) Notice: Subject to any disclaimer, the term of this patent is extended or adjusted under 35 U.S.C. 154(b) by 331 days.

(21) Appl. No.: 10/044,559

(22) Filed: Jan. 11, 2002

(65) Prior Publication Data

US 2002/0121956 A1 Sep. 5, 2002

(30) Foreign Application Priority Data

Jan. 11, 2001 (DE) .......................................... 101 01 071

(51) Int. Cl.⁷ ................................................ H01F 3/00
(52) U.S. Cl. ...................................... 335/296; 335/216
(58) Field of Search .......................... 335/219, 296–300

(56) References Cited

U.S. PATENT DOCUMENTS

| | | | |
|---|---|---|---|
| 4,881,035 A | * 11/1989 | Siebold | 324/320 |
| 5,185,576 A | * 2/1993 | Vavrek et al. | 324/318 |
| 5,345,177 A | 9/1994 | Sato et al. | |
| 5,349,297 A | * 9/1994 | DeMeester et al. | 324/318 |
| 5,439,543 A | * 8/1995 | Dorri et al. | 156/184 |
| 5,617,026 A | 4/1997 | Yoshino et al. | |
| 6,157,280 A | * 12/2000 | Arz et al. | 335/299 |
| 6,285,189 B1 | * 9/2001 | Wong | 324/318 |
| 2002/0196114 A1 | * 12/2002 | Elgin et al. | 335/299 |

FOREIGN PATENT DOCUMENTS

| | | |
|---|---|---|
| DE | OS 198 29 296 | 1/2000 |
| DE | OS 198 56 802 | 8/2000 |

* cited by examiner

*Primary Examiner*—Lincoln Donovan
*Assistant Examiner*—Bernard Rojas
(74) *Attorney, Agent, or Firm*—Schiff Hardin LLP

(57) ABSTRACT

A gradient coil system for a magnetic resonance apparatus has oblong stiffening elements that are heterogeneously arranged in the gradient coil system such that at least one oscillatory mode of the gradient coil system that can be excited during operation of the magnetic resonance apparatus is reduced.

19 Claims, 3 Drawing Sheets

MAGNETIC RESONANCE APPARATUS HAVING A GRADIENT COIL SYSTEM WITH STIFFENING ELEMENTS

BACKGROUND OF THE INVENTION

1. Field of the Invention

Magnetic resonance technology is a known technique for producing images of the inside of the body of an examination subject. To that end, rapidly switched gradient fields that are generated by a gradient coil system are superimposed on a static basic magnetic field that is generated by a basic field magnet system in a magnetic resonance apparatus. The magnetic resonance apparatus further has a radio-frequency system that emits radio-frequency signals into the examination subject for triggering magnetic resonance signals and picks up the magnetic resonance signals that are generated. Magnetic resonance images are produced on the basis of these received signals.

2. Description of the Prior Art

For generating gradient fields, appropriate currents are set in the gradient coils of the gradient coil system. The amplitudes of the required currents are 50 A or more. The current rise and decay rates are up to several 50 kA/s. Given an existing basic magnetic field on the order of magnitude of 1 T, Lorentz forces act on these temporally varying currents in the gradient coils. The Lorentz forces lead to oscillations of the; gradient coil system. For a gradient coil system fashioned approximately hollow-cylindrically, a bending vibration of the gradient coil system is usually dominant. The oscillations proceed to the surface of the device via various propagation paths. There, these mechanical oscillations are converted into acoustic vibrations that ultimately lead to unwanted noise.

One development in the field of magnetic resonant technology involves fast pulse sequences that, among other things, shorten the measuring times. These cause high current amplitudes as well as high current rise and decay rates in the gradient coils. Without counter-measures, these high gradient coil currents cause pronounced Lorentz forces, leading to extremely loud noise. The fast pulse sequences control rapid and frequent changes of the direction of the current in the gradient coils. As a result, the dominant spectral components of the gradient pulse currents are shifted toward higher frequencies. If one of these components has the same frequency as an eigenfrequency of the gradient coil system, then the oscillation excitation of the gradient coil system is at a maximum and the noise that is caused is extremely loud. Such an excitation is more probable for fast pulse sequences than for slower ones.

The high oscillations caused by gradient coil currents in the fast pulse sequences can be countered, for example, with an increase in the stiffness of the gradient coil system. German OS 198 56 802 discloses stiffening the entire gradient coil system. To that end, a segmented cage is arranged between the gradient coils and the shielding coils, the segmented cage being embedded into a casting compound of the gradient coil system and being formed of axially continuous plastic profiles that can be expediently composed of fiber-reinforced or fabric-reinforced plastic. The plastic profiles can be reinforced at points by integrated fiber bundles or mats. Carbon fibers, glass fibers or Kevlar can be utilized as fibers, whereas the matrix of the plastic profiles can be composed of epoxy resin, polyester, vinylester or other thermal plastic materials.

Given a stiffening of the complete gradient coil system, a doubling of the stiffness merely yields an increase in the eigenfrequency by a factor of approximately 1.4. Since the gradient coil system is already currently a very rigid element, technological and economic limits exist as to the achievable increase of the stiffness of the gradient coil system as a whole.

Further, German OS 44 32 747 and German OS 198 29 296 disclose actuators, particularly containing piezoelectric elements, allocated to the gradient coil system whose deformation can be controlled such that deformations of the gradient coil system occurring during operation of the magnetic resonance apparatus are actively countered. The piezoelectric elements are correspondingly controlled by an electrical voltage applied to them.

SUMMARY OF THE INVENTION

An object of the invention is to provide gradient coil system that has improved noise behavior.

This object is achieved in a gradient coil system for a magnetic resonant apparatus according to the invention wherein oblong stiffening elements are heterogeneously arranged in the gradient coil system such that at least one oscillatory mode of the gradient coil system that can be excited during operation of the magnetic resonance apparatus is reduced.

A volume-increasing and costly stiffening of the entire gradient coil system for noise reduction thus is not necessary. Due to the heterogeneous arrangement of stiffening elements in the gradient coil system, a high noise-reducing effect is achieved by the merely partial stiffening of the gradient coil system that is matched to the oscillation mode of the gradient coil system that can be excited during operation of the magnetic resonance apparatus, this being achieved with a small amount of material. The heterogeneous arrangement of the stiffening elements over the gradient coil system means that, for example, the stiffening elements are arranged more densely or less densely according to the distribution of Lorentz forces. As warranted, at least one oscillation mode, particularly a dominant natural oscillation mode, of the gradient coil system is also taken into account in designing the arrangement because, as is known, the oscillatory modes occurring during operation of the magnetic resonance apparatus are defined by the distribution of Lorentz forces in combination with the natural oscillation modes of the gradient coil system and a time curve of gradient coil currents. In an essentially hollow-cylindrical gradient coil system having transverse gradient coils formed by saddle-shaped sub-coils and having a bending vibration as the oscillatory mode that can be excited during operation, for example, the stiffening elements are essentially arranged around saddle-back lines of the sub-coils, and the stiffening elements proceed through the gradient coil system in the longitudinal direction. In a gradient coil system that is cast in a casting compound, the stiffening elements are selected to have a significantly higher tensile strength than the casting compound matrix.

In an embodiment, at least one of the stiffening elements has a mechanical pre-stress that, for example, can be achieved by a suitable installation of the pre-stressed stiffening element and/or a control device for setting a mechanical stress of the stiffening element is allocated to that stiffening element. As a result, the oscillations of the gradient coil system can be designed in view of the oscillatory modes and oscillatory frequencies so that the vibrations are absorbed to a great extent by the gradient coil system, particularly the casting compound matrix, for example, so that only asymmetrical residual oscillations persist.

In an embodiment for an essentially rotationally symmetric gradient coil system, at least one of the stiffening elements has a longitudinal course that intersects at least one straight line parallel to the rotational axis. As a result, effects similar to those of the aforementioned embodiment can be achieved or intensified.

In a further embodiment, the stiffening elements are fibers and/or fiber bundles, preferably of glass, carbon and/or aramid fibers or bundles. Particularly given a pronounced stretching of the fibers, the fibers do not behave according to Hookes' law, allowing operating points in the force-path diagram of the fibers that promote the aforementioned effects to be set, for example on the basis of a mechanical tensioning of the fibers. If carbon fibers are used, electromagnetic compatibility with the magnetic resonance image generation must be taken into consideration due to their electrical conductivity.

DESCRIPTION OF THE PREFERRED EMBODIMENTS

Figure 1:
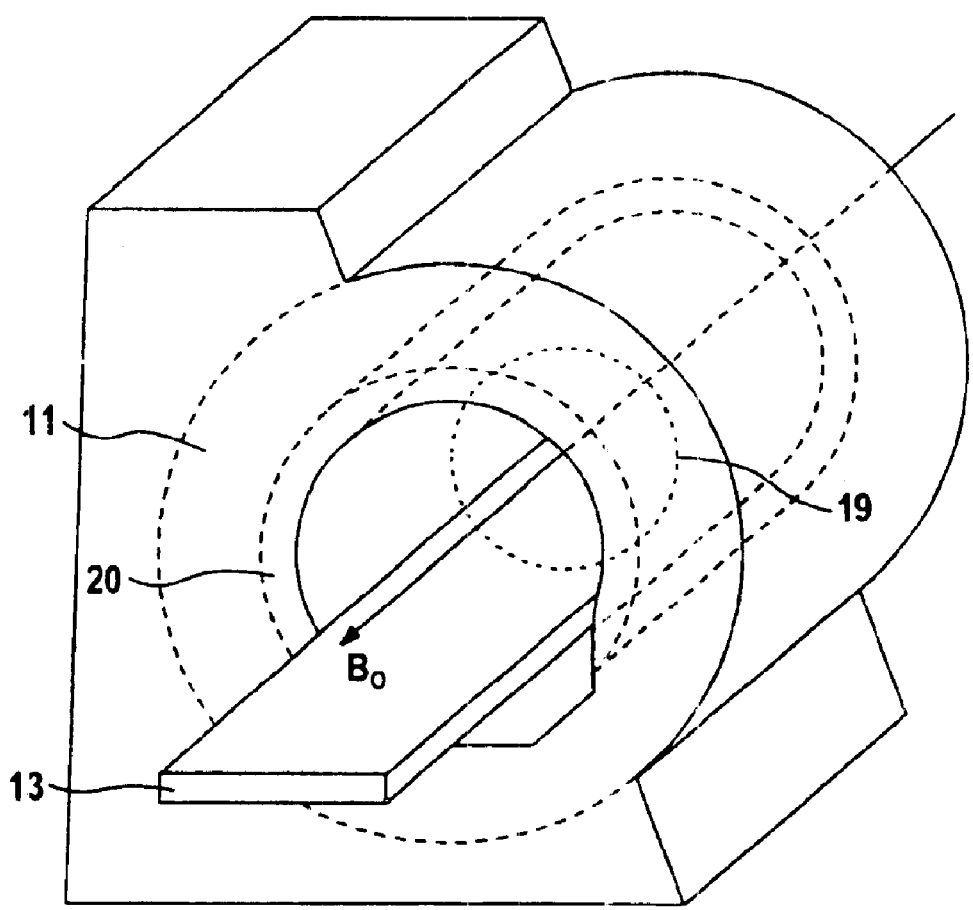
FIG. 1 schematically illustrates a magnetic resonance apparatus in which the invention can be installed.

FIG. 1 is a perspective view of a magnetic resonance apparatus. The magnetic resonance apparatus has a basic field magnet system 11 for generating a static basic magnetic field $B_0$ that is as uniform as possible at least within an imaging volume 19. The magnetic resonance apparatus further has a gradient coil system 20 for generating gradient fields. A movable support device 13 of the apparatus serves, among other things, for positioning a region of an examination subject borne on the bearing device 13 to be imaged in the imaging volume 19. For clarity, further components of the apparatus, for example a radio-frequency system, are not shown.

The gradient coil system 20 is fashioned essentially hollow-cylindrically and contains, among other things, a longitudinal gradient coil for generating a magnetic gradient field having a gradient in the direction of the basic magnetic field $B_0$, two transverse gradient coils for generating magnetic gradient fields having gradients perpendicular to the basic magnetic field $B_0$, cooling devices, shim devices and shielding coils belonging to the respective gradient coils.

Figure 2:
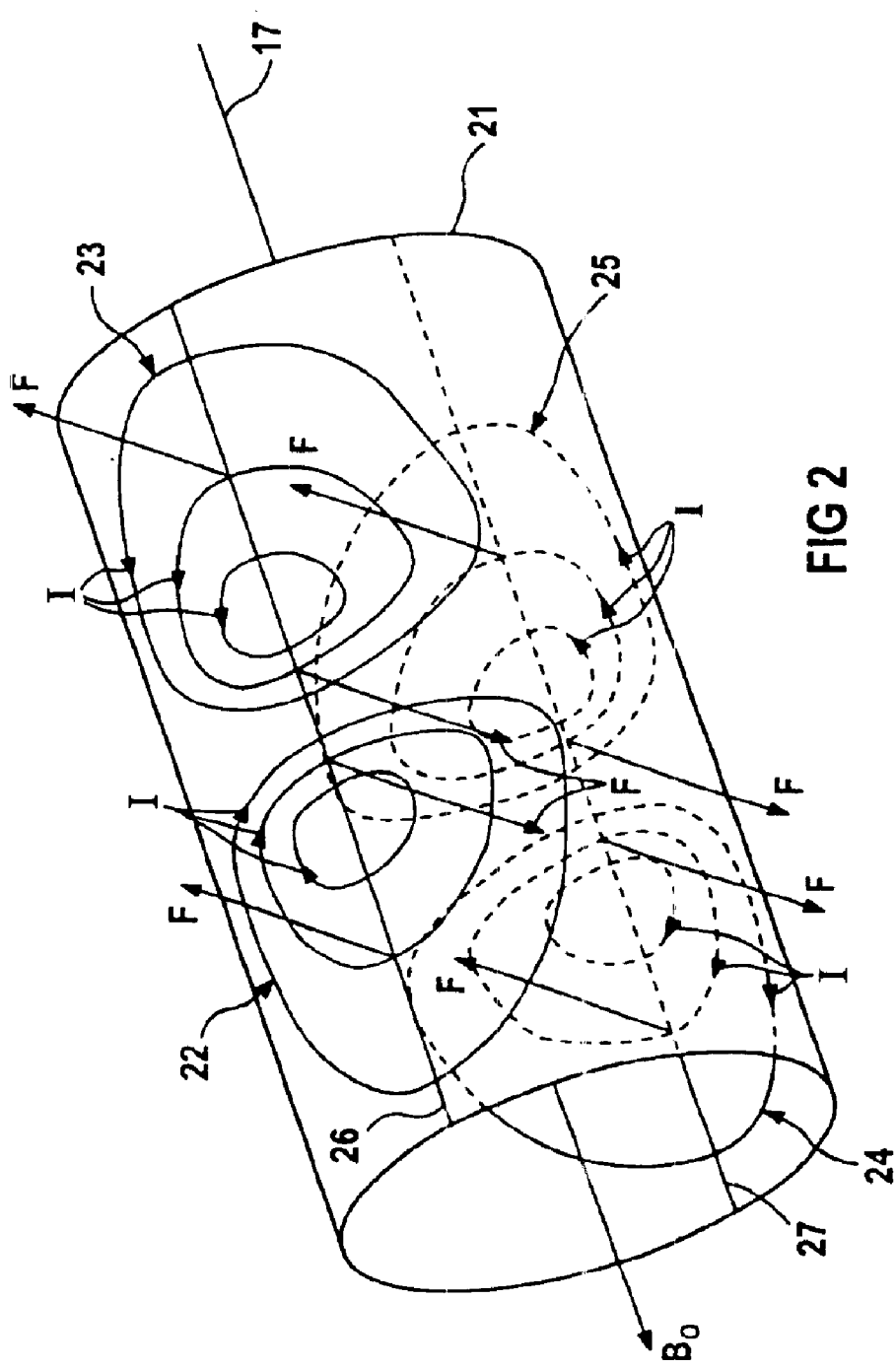
FIG. 2 shows a layer of a hollow-cylindrical gradient coil system of the magnetic resonance apparatus of FIG. 1.

FIG. 2 shows a hollow-cylindrical layer 21 of the gradient coil system 20 within which one of the transverse gradient coils is arranged. The transverse gradient coil has four sub-coils 22 through 25 which are saddle-shaped, and in this exemplary embodiment are of a type referred to as fingerprint coils. The path of a conductor of the sub-coils 22 through 25 is only schematically outlined and is shown with few turns as an example. During operation of the transverse gradient coil, the respective turns of the sub-coils 22 through 25 each has a current I flowing therein in a direction indicated by the arrows. The current in the corresponding turns in the respective sub-coils 22 through 25 is identical. Two saddle back lines 26 and 27 are indicated for the saddle-shaped sub-coils 22 through 25. Given an existing basic magnetic field $B_0$ and a current-carrying gradient coil, Lorentz forces F act on sections of the conductor of the sub-coils 22 through 25. These Lorentz forces F are maximum in conductor sections that proceed perpendicularly to the basic magnetic field $B_0$. No Lorentz forces F act on conductor sections that proceed essentially parallel to the basic magnetic field $B_0$. i.e., the maximum Lorentz forces F act approximately along the saddle back lines 26 and 27. These are identified with corresponding arrows in FIG. 2. Due to the temporally varying current I, the Lorentz forces F cause—among other things—a bending vibration of the gradient coil system 20 along a principal axis 17 of the hollow cylinder.

The above explanation also applies to the other transverse gradient coil that is identically constructed with respect to the transverse gradient coil described above and is rotated by 90° in the circumferential direction of the gradient coil system 20 in a hollow-cylindrical layer arranged above or under the layer 21.

Figure 3:
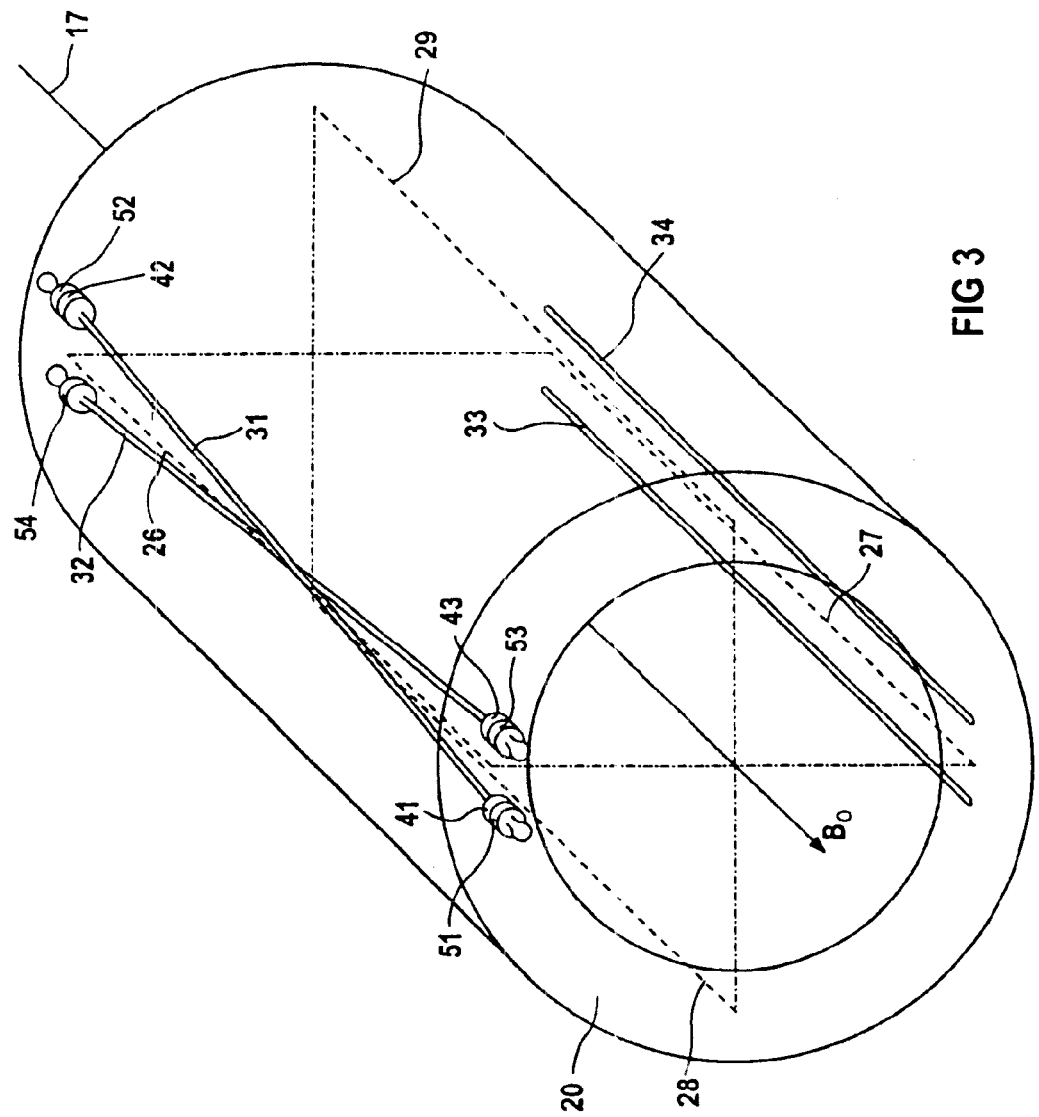
FIG. 3 shows an arrangement of stiffening elements within the hollow-cylindrical gradient coil system in accordance with the invention.

As an exemplary embodiment of the invention, FIG. 3 shows a perspective view of the gradient coil system 20 of the magnetic resonance apparatus having oblong stiffening elements 31 through 34. The stiffening elements 31 through 34 are arranged heterogeneously distributed in circumferential direction of the gradient coil system 20 such that at least the bending vibration of the gradient coil system 20 is reduced. In addition to the saddle back lines 26 and 27 of the transverse gradient coil shown in FIG. 2, the saddle back lines 28 and 9 of the other transverse gradient coil also are indicated. Stiffening elements in an embodiment as fibers or fiber bundles of carbon, glass and/or aramid fibers are cast with the conductors into the gradient coil system 20, essentially in the regions around the saddle back lines 26–29.

The stiffening elements 33 and 34 arranged around the saddle line 27 are thereby arranged essentially parallel to the saddle back line 27 or to the principal axis 17 of the hollow cylinder. The stiffening elements 31 and 32 arranged around the saddle line 26, in contrast, have a longitudinal course that intersects the saddle back line 26 or at least one straight line parallel to the principal axis 17 of the hollow cylinder. The stiffening element 32 is conducted out of the casting compound matrix of the gradient coil system 20 at the end faces of the gradient coil system 20. At one end face, the stiffening element 32 is conducted through an active element 43 fashioned as an apertured disk, for example a piezo-electric element, and through a flange 53 fashioned like an apertured disk. The end of the stiffening element 32 is thickened such that it cannot be pulled through the opening of the flange 53 even given a corresponding tensile stress. The active element 43 can be operated as sensor and/or as actuator. Given sensor operation, the mechanical tension of the reinforcing element 32 can be effected by a corresponding stretching or compression of the active element 43. Optimum mechanical tension of the stiffening element 32 and/or 31 can be calculated, for example, for different time-successive vibration cycles. Given actuator operation, the mechanical stressing of the stiffening element 32 can be modified by controlling the deformation of the active element 43. This also can be dynamically implemented during an operation of the gradient coil system 20. At the other end face, the stiffening element 32 is merely conducted through a flange 54 fashioned as anapertured disk, while foregoing an active element. Compared to the stiffening element 32, the stiffening element 31 has active elements 41 and 42 at both end faces. These active elements 41 and 42 also can be operated as sensor and/or as actuator.

Corresponding to the stiffening elements 31 through 34 arranged around the saddle back lines 26 and 27, further stiffening elements are arranged around the saddle back lines 28 and 29 of the other transverse gradient coil, these not being shown in FIG. 3 for clarity. In one embodiment, further, the stiffening elements 31 through 34 are cast in the casting compound with a fixed mechanical pre-stress during manufacture of the gradient coil system 20.

Although modifications and changes may be suggested by those skilled in the art, it is the intention of the inventor to embody within the patent warranted hereon all changes and modifications as reasonably and properly come within the scope of his contribution to the art.

I claim as my invention:

1. In a magnetic resonance apparatus having a basic field magnet which generates a basic magnetic field, the improvement of a gradient coil system operable with at least one current flowing in said gradient coil system in said basic magnetic field, said gradient coil system having at least one oscillatory mode which is excitable during said operation of said gradient coil system, and having stiffening elements heterogeneously arranged in said gradient coil system which reduce said at least one oscillatory mode by mechanically stiffening said gradient coil system.

2. A gradient coil system as claimed in claim 1 comprising gradient coils cast in a casting compound, and wherein at least one of said stiffening elements has a section also cast in said casting compound.

3. A gradient coil system as claimed in claim 1 wherein said stiffening elements comprise a fiber.

4. A gradient coil system as claimed in claim 3 wherein said fiber is selected from the group consisting of glass fibers, carbon fibers and aramid fibers.

5. A gradient coil system as claimed in claim 1 wherein at least one of said stiffening elements is a bundle of fibers.

6. A gradient coil system as claimed in claim 5 wherein said fibers in said bundle of fibers are selected from the group consisting of glass fibers, carbon fibers and aramid fibers.

7. A gradient coil system as claimed in claim 1 wherein at least one of said stiffening elements is pre-stressed.

8. A gradient coil system as claimed in claim 1 further comprising a controllable device mechanically connected to at least one of said stiffening elements for setting a mechanical stress of said at least one of said stiffening elements.

9. A gradient coil system as claimed in claim 8 wherein said controllable device comprises a piezoelectric element disposed to mechanically interact with said at least one of said stiffening elements to set said mechanical stress.

10. A gradient coil system as claimed in claim 8 wherein said at least one of said stiffening elements has a longitudinal end, and wherein said controllable device is disposed at said longitudinal end.

11. A gradient coil system as claimed in claim 1 further comprising a sensing device in mechanical contact with at least one of said stiffening elements for sensing a mechanical stress of said at least one of said stiffening elements.

12. A gradient coil system as claimed in claim 11 wherein said sensing device comprises a piezoelectric element.

13. A gradient coil system as claimed in claim 11 wherein said at least one of said stiffening elements has a longitudinal end, and wherein said sensing device is disposed at said longitudinal end.

14. A gradient coil system as claimed in claim 1 wherein said gradient coil system is approximately rotationally symmetrical relative to a central longitudinal axis.

15. A gradient coil system as claimed in claim 14 wherein said stiffening elements are heterogeneously disposed along a closed loop in a rotational direction around said gradient coil system.

16. A gradient coil system as claimed in claim 14 wherein at least one of said stiffening elements has a longitudinal path that penetrates said gradient coil system in a direction of said longitudinal axis.

17. A gradient coil system as claimed in claim 14 wherein at least one of said stiffening elements has a longitudinal path parallel to said longitudinal axis.

18. A gradient coil system as claimed in claim 14 wherein at least one of said stiffening elements has a longitudinal path that intersects a straight line parallel to said longitudinal axis.

19. A gradient coil system as claimed in claim 1 wherein said gradient coil system has a hollow-cylindrical shape.

* * * * *